United States Patent [19]

Martin et al.

[11] 3,999,955

[45] Dec. 28, 1976

[54] STRIP FOR LEAD FRAMES

[75] Inventors: Jack P. Martin, Lower Burrell; Thomas H. Gray, Pittsburgh, both of Pa.

[73] Assignee: Allegheny Ludlum Industries, Inc., Pittsburgh, Pa.

[22] Filed: July 15, 1975

[21] Appl. No.: 596,039

[52] U.S. Cl. .............................. 29/191.6; 29/196.3; 29/196.6; 29/199
[51] Int. Cl.² ................... B32B 15/18; B32B 15/20
[58] Field of Search ......... 204/40; 29/196.3, 196.6, 29/199, 191.6

[56] References Cited

UNITED STATES PATENTS

| | | | |
|---|---|---|---|
| 2,490,700 | 12/1949 | Nachtman | 204/40 X |
| 3,076,260 | 2/1963 | Roehl | 29/196.3 X |
| 3,249,409 | 5/1966 | McLeod | 29/196.3 X |
| 3,749,558 | 7/1973 | Dillenschneider | 29/196.3 X |

*Primary Examiner*—Arthur J. Steiner
*Attorney, Agent, or Firm*—Vincent G. Gioia; Robert F. Dropkin

[57] ABSTRACT

There is disclosed a material useful for making lead frames which comprises a core of ferritic stainless steel electroplated with a first layer of copper and an outside layer of nickel or tin, after which the strip is precision rolled to final gauge.

5 Claims, No Drawings

STRIP FOR LEAD FRAMES

BACKGROUND OF THE INVENTION

Lead frames are small metal articles that are employed to connect integrated circuits to devices in which they are used. One of the primary functions provided by the lead frame is to support the integrated circuit. The integrated circuit may be attached to the lead frame by means of a silicon-gold eutectic or silver-filled epoxy bond. The integrated circuit is also usually encapsulated in a ceramic or plastic envelope. In addition to supporting the integrated circuit, the lead frame provides connections through the envelope. These connections are used to attach the integrated circuit to the device in which it performs. The integrated circuit is electrically connected to the lead frame, usually by thermocompression or ultrasonic bonding very small gold or aluminum wires between connecting points on the integrated circuit and connecting points on the lead frame. By way of example, gold wires one mil in diameter may be employed, and they may be connected to the lead frame by thermocompression bonding. After being electrically connected to the lead frame, the integrated circuit is encapsulated so that leads on the lead frame are bonded to, but extend through, the ceramic or plastic capsule.

To perform its many functions, the lead frame must be made of material having many specific properties, among which are the following. A lead frame must be made of material that has good electric conductivity which is necessary to transmit electrical impulses to and from the integrated circuit. It is also necessary for a lead frame to be made of material that has good thermal conductivity because conducting heat through the lead frame is the major means of removing heat generated in the integrated circuit. Fortunately, satisfying both of these requirements is possible because thermal conductivity is directly related to electrical conductivity according to the law of Wiedmann-Franz. Good thermal conductivity is necessary in all lead frames but it is especially essential in lead frames connecting high powered integrated circuits with their environment. Lead frames must have good mechanical properties because they must support the integrated circuit and have good enough properties to maintain it in the device in which it is employed. Lead frames must have sufficient ductility to be capable of accepting precision forming, which involves the ability to be rolled to very exact thicknesses and with small tolerances. In addition, lead frames must be capable of being punched or etched to patterns with exacting dimensions. Lead frames must also be made of material that has good corrosion resistance in order to avoid being corroded during the fabrication stages of an integrated circuit. Current manufacturing technology dictates that the material of a lead frame should be easy to plate with gold or silver. For example, limited portions of lead frames are plated with gold or silver in order to make adequate electrical connections. Because the gold or silver plating is applied only to limited portions and the external leads may remain unplated, lead frames must be made of material that is itself easy to soft solder so that the integrated circuits can be readily connected to other devices. Lead frames must also be made of material that seals well with encapsulating material. Thus, the surface of the lead frame must be capable of being wetted either by the plastic that encapsulates the integrated circuit or by the ceramic material that encapsulates the integrated circuit. If a ceramic material is employed to produce a hermetic capsule, it is also essential that the lead frame have low thermal expansion so that thermal stresses during fabrication or subsequent use will not cause the hermetic seal between the lead frame metal and encapsulant to fail. A lead frame also must be made of a material that is reasonable in cost in order for its general use in inexpensive devices to be feasible.

Finding a material with all of these properties is difficult, and, as a result, compromises are made. One of the more successful materials with regard to properties is pure nickel. However, precision-rolling pure nickel to very thin strips with precise dimensions is very expensive because of high scrap losses of an intrinsically high cost material. Additionally, pure nickel has some undesirable properties for lead frames; most notably, pure nickel has high thermal expansion. An alloy of 42% nickel and the balance iron is also commonly employed in manufacture of lead frames. The disadvantages of 42% nickel alloy are high cost and a relatively low thermal conductivity which necessitates sufficient thickness of high-cost silver or gold platings to raise the thermal conductivity to adequate levels. The hardness of 42% nickel also yields it incapable of being thermocompression bonded to the interconnecting wires of the integrated circuit. Copper or copper alloys are also used; however, their corrosion resistance is inferior and may in some cases preclude their use.

THE INVENTION

This invention includes a process for producing a metal strip useful for the production of lead frames which have all of the attributes set forth above. The process includes preparing a ferritic stainless steel, i.e. an iron-chromium alloy, in the form of a thin strip that is substantially thicker than the final product, preferably about twice as thick as the final product. This strip is then provided with a nickel strike to condition its surface to accept subsequent coatings. A nickel strike is a very thin layer of nickel that is plated onto the ferritic stainless steel under conditions where the protective coating of chromium oxide is absent from the surface of the stainless steel.

The ferritic stainless steel with a nickel strike on its surface is then subjected to electrodeposition of copper. A layer of copper is electrodeposited over the nickel strike to a thickness dictated by the desirability of having a minimum of 50 microinches of copper on the surface following cold reduction to final gauge. Preferably, the copper layer, after cold rolling, is from about 350 to 600 microinches thick. The copper coated ferritic stainless steel is then provided with a continuous layer of either nickel or tin of sufficient thickness so that, after final rolling, the outer layer is at least 50 microinches thick.

The strip of ferritic stainless steel with all coatings applied to it is then precision cold rolled to reduce its thickness to achieve the desired mechanical properties and a bright, smooth dense surface. In a preferred embodiment, a cold reduction of at least 50% results in a shiny strip with exact dimensions having a continuous and intact layer of nickel or tin on the outside. This strip can be precision stamped or etched to any desired lead frame configuration.

The ferritic stainless steel core provides a mechanically strong base for the lead frame. The ferritic stainless steel has a lower thermal expansion than either Ni, or Cu and Cu-alloys. It is much lower in cost than pure Ni, Ni-alloys, Cu, or Cu-alloys. In the form of a composite utilizing a copper layer it is an effective heat conductor. The outer layers of copper and nickel have their thermal expansions restrained by the ferritic stainless steel core maintaining the lower thermal expansion of the ferritic stainless steel. The composite having a Ni outer layer has good thermal conductivity, good electrical conductivity, a surface which is similar to pure nickel lead frames in that it can be easily plated with gold or silver. With these precious metal platings it is easy to thermocompression or ultrasonic bond and is easy to solder. The composite with a tin outer layer has all of the above attributes without plating with silver or gold and is believed to be easily thermocompression or ultrasonic bonded to interconnection wires. In both cases the good characteristics of ferritic stainless steel such as high mechanical strength and lower thermal expansion are preserved, and the composite material has improved electrical and thermal conductivity through the use of the copper intermediate layer.

The composite strip with an outer layer of tin also has all of the desirable properties of ferritic stainless steel, the electrical and thermal conductivity of copper, and the good surface characteristics of tin. Copper has poor corrosion resistance and cannot be exposed in a lead frame. For example, copper must be shielded from an integrated circuit deposited on a silicon single crystal wafer because copper diffuses into the silicon and changes its properties. Accordingly, in accordance with this invention, copper must always be beneath a continuous and intact layer of nickel or tin. This circumvents one of the undesirable features of copper in that the nickel or tin provides a more stable, corrosion resistant surface, and one more readily bonded to other materials.

This invention also includes the product from the process described above. The product of the process is a strip of material having a ferritic stainless steel core, an intermediate layer of copper, and a continuous outer layer of nickel or tin; the composite strip being cold rolled, preferably between 40 and 60%, to its final thickness and having a final thickness of less than 0.015 inches. As set forth above, the product of this invention has properties such that it may readily be formed into a lead frame having all of the thermal, electrical, and mechanical properties set forth hereinabove. The process of this invention provides a product which has properties that are equal to or better than more expensive lead frame materials. Very little of the expensive materials are used and they are employed at a point in the process where there is little waste. The final product has excellent and controllable mechanical properties and a bright, smooth, shiny, dense surface that is both physically and chemically well suited for use in lead frames.

DETAILED DESCRIPTION OF THE INVENTION

The following examples are provided to demonstrate specific embodiments of the invention.

EXAMPLE 1

A ferritic chromium-iron alloy containing 13-14% chromium and generally known as type 404 stainless steel was rolled to a strip of intermediate thickness (0.025 inches) and annealed. The strip was provided with a nickel strike by immersing it in an aqueous solution containing 240 grams per liter of nickel chloride hexahydrate and 71 milliliters of an aqueous solution of 37% hydrogen chloride. The type 404 stainless steel was connected as the cathode, and a pure nickel anode was employed. The bath was maintained at 80° F, and a current of 0.5 amperes per square inch of cathode area was passed through the bath for 30 seconds. There resulted a nickel strike less than 30 microinches thick deposited on the cathode.

The specimens having a nickel strike on their surfaces were then immersed in an aqueous solution containing 240 grams per liter of copper sulfate and 33 milliliters per liter of 90% sulfuric acid. The type 404 stainless steel was connected as the cathode, and a pure copper anode was employed. The bath was maintained at 75° F, and a current of 0.152 amperes per square inch of cathode area was passed through the bath for 6.4 minutes. A layer of copper 295 microinches thick was deposited.

Specimens were taken from the copper bath and thoroughly washed and then immersed in a bath containing 38.4 grams per liter of nickel chloride hexahydrate, 273.5 grams per liter of nickel sulfate hexahydrate, and 26 grams per liter of boric acid. The specimens were connected as the cathode, and a pure nickel anode was employed. Electrodeposition of nickel was effected by maintaining the bath at 75° F and passing a current of 0.25 amperes per square inch of cathode area through the bath for 6.4 minutes. Under these conditions, a layer of nickel 250 microinches thick was deposited. The specimens had a dull finish when they were removed from the bath and cleaned. The specimens were then precision cold rolled to 0.010 inches thick after which they had a mirror finish. Visual and microscopic examination indicated that the finish was a continuous film of nickel containing no cracks, breaks or spalls.

Table I below indicates the physical characteristics of the material produced compared with the 404 stainless steel.

TABLE I

| Material | Plating Thickness (microinches) | Electrical Conductivity (1/micro ohm cm) |
|---|---|---|
| 404 ss | — | 0.0198 |
| 404 + Cu + Ni | 40 Cu + 80 Ni | 0.0257 |

It is evident from Table I that the layer of copper and layer of nickel deposited on the type 404 stainless steel significantly improves the electrical conductivity of the specimen. The nickel layer had all of the characteristics of pure nickel with regard to its affinity for gold, silver, solder, plastic, and ceramic materials. The composite strip exhibited substantially the thermal expansion characteristics of type 404 stainless steel, and it was substantially lower than the thermal expansion of nickel.

When the strip is punched and etched using conventional equipment and techniques and conventional etching material, the lead frames that are produced are sound with regard to the adherence of the plating and are as dimensionally exact as are lead frames produced by the same techniques employing conventional materials.

EXAMPLE 2

Type 404 stainless steel was rolled and prepared with a nickel strike and a layer of copper as set forth in Example 1. The copper coated stainless steel was then immersed in a bath containing 26.8 ounces per gallon of $Sn(BF_4)_2$, 10.8 ounces per gallon of metallic tin, 10.0 ounces per gallon of $HBF_4$, 3.3 ounces per gallon of $H_3BO_3$, and 0.8 ounces per gallon of gelatin. The metallic tin was in the form of a powder.

The copper coated stainless steel was connected as the cathode and a pure tin anode was used. The bath was maintained at 75° F, and a current of 0.11 amperes per square inch of cathode area was passed through the bath for 10 minutes which resulted in a layer of tin 105 microinches thick. The tin plate adhered well.

The composite strip was cold rolled to 0.010 inches thick and after rolling, a smooth continuous layer of tin, 105 microinches thick, was the outer layer of the strip. The composite strip had the surface properties of tin, especially exhibiting excellent solderability and corrosion resistance.

When the composite strip is punched and etched using conventional materials and techniques, lead frames with excellent properties and exact dimensions are produced.

The process of this invention may be improved by employing brightening and leveling additives in the copper plating bath. These additives cause a layer of copper of uniform thickness to be deposited and thereby avoids copper penetrating the final nickel or tin coating during the cold rolling process. The use of these additives is especially indicated when thicker layers of copper are deposited.

The mechanical properties of the composite strip can be controlled by the amount of cold rolling. Preferably cold rolling should reduce the thickness about 50%, but thickness reductions between 40 and 60% will produce adequate material. With thickness reductions in this region, the outer layers of nickel or tin should be at least 50 microinches thick after cold rolling. The copper layer should be thick enough to raise the electrical and thermal conductivity of the composite to the desired level. Copper should be at least 50 microinches thick and preferably about 350 to 600 microinches thick in the final cold rolled product.

What is claimed is:

1. A lead frame strip material comprising a core of ferritic stainless steel, a continuous nickel strike layer in contact with and surrounding said ferritic stainless steel, a continuous inner layer of copper in contact with and surrounding said nickel strike layer, a continuous layer of metal selected from the group consisting of nickel and tin in contact with and surrounding said layer of copper, said composite strip having been cold reduced from 40 to 60% to a thickness of at most 30 mils and having a dense, shiny, continuous outer surface.

2. The strip material of claim 1 wherein said outer layer is a layer of nickel at least 50 microinches thick.

3. The strip material of claim 1 wherein said outer layer is a layer of tin at least 50 microinches thick.

4. The strip material of claim 1 wherein said inner layer is at least 50 microinches thick.

5. The strip material of claim 1 wherein said inner layer is from about 350 microinches to about 600 microinches thick.

* * * * *